(12) United States Patent
Chidambarrao et al.

(10) Patent No.: US 8,633,071 B2
(45) Date of Patent: *Jan. 21, 2014

(54) SILICON DEVICE ON Si: C-OI AND SGOI AND METHOD OF MANUFACTURE

(75) Inventors: Duresti Chidambarrao, Weston, CT (US); Omer H. Dokumaci, Wappingers Falls, NY (US); Oleg G. Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/278,667

(22) Filed: Oct. 21, 2011

(65) Prior Publication Data

US 2012/0052653 A1    Mar. 1, 2012

Related U.S. Application Data

(62) Division of application No. 11/757,883, filed on Jun. 4, 2007, now Pat. No. 8,119,472, which is a division of application No. 10/715,400, filed on Nov. 19, 2003, now Pat. No. 7,247,534.

(51) Int. Cl.
*H01L 21/8238* (2006.01)

(52) U.S. Cl.
USPC .......................... 438/223; 438/224; 438/227

(58) Field of Classification Search
USPC ......................................... 438/223, 224, 227
See application file for complete search history.

(56) References Cited

U.S. PATENT DOCUMENTS

| | | |
|---|---|---|
| 3,602,841 A | 8/1971 | McGroddy |
| 4,478,655 A | 10/1984 | Nagakubo et al. |
| 4,665,415 A | 5/1987 | Esaki et al. |
| 4,853,076 A | 8/1989 | Tsaur et al. |
| 4,855,245 A | 8/1989 | Neppl et al. |
| 4,952,524 A | 8/1990 | Lee et al. |
| 4,958,213 A | 9/1990 | Eklund et al. |

(Continued)

FOREIGN PATENT DOCUMENTS

| | | |
|---|---|---|
| JP | 64-76755 | 3/1989 |
| JP | 07169926 | 7/1995 |

(Continued)

OTHER PUBLICATIONS

Office Action dated Mar. 18, 2011 in U.S. Appl. No. 11/757,874.

(Continued)

*Primary Examiner* — James Mitchell
(74) *Attorney, Agent, or Firm* — Ian MacKinnon; Roberts Mlotkowski Safran & Cole, P.C.

(57) ABSTRACT

A semiconductor structure and method of manufacturing is provided. The method of manufacturing includes forming shallow trench isolation (STI) in a substrate and providing a first material and a second material on the substrate. The first material and the second material are mixed into the substrate by a thermal anneal process to form a first island and second island at an nFET region and a pFET region, respectively. A layer of different material is formed on the first island and the second island. The STI relaxes and facilitates the relaxation of the first island and the second island. The first material may be deposited or grown Ge material and the second material may deposited or grown Si:C or C. A strained Si layer is formed on at least one of the first island and the second island.

18 Claims, 8 Drawing Sheets

(56) References Cited

U.S. PATENT DOCUMENTS

| | | |
|---|---|---|
| 5,006,913 A | 4/1991 | Sugahara et al. |
| 5,060,030 A | 10/1991 | Hoke |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,698,869 A | 12/1997 | Yoshimi et al. |
| 5,763,905 A | 6/1998 | Harris |
| 5,840,593 A | 11/1998 | Leedy |
| 5,861,651 A | 1/1999 | Brasen et al. |
| 5,879,996 A | 3/1999 | Forbes |
| 5,880,040 A | 3/1999 | Sun et al. |
| 5,891,769 A | 4/1999 | Liaw et al. |
| 5,898,203 A | 4/1999 | Yoshitomi et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,981,356 A | 11/1999 | Hsueh et al. |
| 5,989,978 A | 11/1999 | Peidous |
| 5,994,756 A | 11/1999 | Umezawa et al. |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,080,637 A | 6/2000 | Huang et al. |
| 6,090,684 A | 7/2000 | Ishitsuka et al. |
| 6,093,621 A | 7/2000 | Tseng |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,271,100 B1 | 8/2001 | Ballantine et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,361,885 B1 | 3/2002 | Chou |
| 6,362,082 B1 | 3/2002 | Doyle et al. |
| 6,365,484 B1 | 4/2002 | Nowak et al. |
| 6,368,931 B1 | 4/2002 | Kuhn et al. |
| 6,399,970 B2 | 6/2002 | Kubo et al. |
| 6,403,486 B1 | 6/2002 | Lou |
| 6,403,975 B1 | 6/2002 | Brunner et al. |
| 6,406,973 B1 | 6/2002 | Lee |
| 6,410,371 B1 | 6/2002 | Yu et al. |
| 6,461,936 B1 | 10/2002 | Von Ehrenwall |
| 6,476,462 B2 | 11/2002 | Shimizu et al. |
| 6,483,171 B1 | 11/2002 | Forbes et al. |
| 6,492,216 B1 | 12/2002 | Yeo et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,551,871 B2 | 4/2003 | Takamura |
| 6,583,060 B2 | 6/2003 | Trivedi |
| 6,620,664 B2 | 9/2003 | Ma et al. |
| 6,696,348 B1 | 2/2004 | Xiang |
| 6,703,271 B2 | 3/2004 | Yeo et al. |
| 6,717,216 B1 | 4/2004 | Doris et al. |
| 6,743,705 B2 | 6/2004 | Mehrotra et al. |
| 6,764,908 B1 | 7/2004 | Kadosh et al. |
| 6,825,529 B2 | 11/2004 | Chidambarrao et al. |
| 6,831,292 B2 | 12/2004 | Currie et al. |
| 6,855,642 B2 | 2/2005 | Tanabe et al. |
| 6,891,192 B2 | 5/2005 | Chen et al. |
| 6,900,103 B2 | 5/2005 | Fitzgerald |
| 6,905,923 B1 | 6/2005 | Paton et al. |
| 6,939,814 B2 | 9/2005 | Chan et al. |
| 6,974,981 B2 | 12/2005 | Chidambarrao et al. |
| 6,977,194 B2 | 12/2005 | Belyansky et al. |
| 6,982,229 B2 | 1/2006 | Suvkhanov et al. |
| 7,015,082 B2 | 3/2006 | Doris et al. |
| 7,034,362 B2 | 4/2006 | Rim |
| 7,037,770 B2 | 5/2006 | Chidambarrao et al. |
| 7,049,660 B2 | 5/2006 | Bedell et al. |
| 7,115,954 B2 | 10/2006 | Shimizu et al. |
| 7,138,310 B2 | 11/2006 | Currie et al. |
| 7,303,949 B2 * | 12/2007 | Chen et al. ............ 438/199 |
| 7,342,289 B2 | 3/2008 | Huang et al. |
| 2001/0003364 A1 | 6/2001 | Sugawara et al. |
| 2001/0009784 A1 | 7/2001 | Ma et al. |
| 2002/0061615 A1 | 5/2002 | Kawagoe et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0162348 A1 * | 8/2003 | Yeo et al. ............ 438/218 |
| 2004/0005750 A1 | 1/2004 | Chen et al. |
| 2004/0029323 A1 | 2/2004 | Shimizu et al. |
| 2004/0106267 A1 | 6/2004 | Beyer et al. |
| 2004/0124476 A1 | 7/2004 | Miyano |
| 2004/0132267 A1 | 7/2004 | Sadana et al. |
| 2004/0135138 A1 | 7/2004 | Hsu et al. |
| 2004/0142537 A1 | 7/2004 | Lee et al. |
| 2004/0150042 A1 | 8/2004 | Yeo et al. |
| 2004/0195623 A1 | 10/2004 | Ge et al. |
| 2004/0212035 A1 | 10/2004 | Yeo et al. |
| 2004/0217437 A1 | 11/2004 | Franke et al. |
| 2004/0238914 A1 | 12/2004 | Deshpande et al. |
| 2004/0253776 A1 | 12/2004 | Hoffmann et al. |
| 2004/0256614 A1 | 12/2004 | Ouyang et al. |
| 2004/0262683 A1 | 12/2004 | Bohr et al. |
| 2004/0262784 A1 | 12/2004 | Doris et al. |
| 2005/0035470 A1 | 2/2005 | Ko et al. |
| 2005/0040460 A1 | 2/2005 | Chidambarrao et al. |
| 2005/0082616 A1 * | 4/2005 | Chen et al. ............ 257/350 |
| 2005/0082634 A1 | 4/2005 | Doris et al. |
| 2005/0085022 A1 * | 4/2005 | Chidambarrao et al. ..... 438/151 |
| 2005/0093030 A1 | 5/2005 | Doris et al. |
| 2005/0093104 A1 * | 5/2005 | Ieong et al. ............ 257/627 |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |
| 2007/0298566 A1 | 12/2007 | Moroz et al. |

(56) References Cited

U.S. PATENT DOCUMENTS

FOREIGN PATENT DOCUMENTS

| JP | 07183237 | 7/1995 |
|---|---|---|
| JP | 0897163 | 4/1996 |
| JP | W002/43151 A1 | 5/2002 |
| JP | 2002203912 | 7/2002 |
| JP | 2002217413 | 8/2002 |
| JP | 2005039171 | 2/2005 |
| KR | 19980024235 | 10/1998 |
| KR | 20030058571 | 7/2003 |
| WO | WO2005013375 | 2/2005 |

OTHER PUBLICATIONS

Dearnaley, G., "Electrical phenomena in amorphous oxide films", 1970, Rep Prog. Physics. vol. 33, pp. 1129-1191.
International Search Report and Written Opinion PCT/US04/20904.
Ray S K et al. Comparison of Si1-yCy films produced by solid-phase epitaxy and rapid thermal chemical vapour deposition, Thin Solid Films, Elsevier-Sequoia S.A. Lausanne, Ch, vol. 294, No. 1-2 Feb. 15, 1997, pp. 149-152.
Kobayashi et al. Synthesis of metastable 1-17 group-IV alloy semiconductors by ion implantation and ion-beam induced epitaxial crystallization Applied Surface Science, Elsevier, Amsterdam, NL. vol. 100-101, Jul. 2, 1996 pp. 498-502.
Randa, "A Novel Elevated Source/Drain PMosfet formed by Ge-B/Si Intermixing." 2002 IEEE.
Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.
H.S. Momose et al., "Temperature Dependence of Emitter-Base Reverse Stress Degradation and its Mechanism Analyzed by MOS Structures." 1989 IEEE, Paper 6.2, pp. 140-143.
C.J. Huang, et al., "Temperatures Dependence and Post-Stress Recovery of Hot Electron Degradation Effects in Bipolar Transistors," IEEE, 1991, Bipolar Circuits and Technology Meeting 7.5, pp. 170-173.
S.R. Sheng, et al., "Degradation and Recovery of SiGe HBTs Following Radiation and Hot-Carrier Stressing." IEEE 2003, Semiconductor Device Research Symposium, pp. 14-15.
Z. Yang, et al., "Avalanche Current Induced Hot Carrier Degradation in 200 GHz SiGe Heterojunction Bipolar Transistors." IEEE 2003, Reliability Physics Symposium Proceedings, pp. 1-5.
H. Li, et al., "Design of W-Band VCOs with High Output Power for Potential Application in 77 GHz Automotive Radar Systems." 2003, IEEE GaAs Digest, pp. 263-66.
H. Wurzer, et al., "Annealing of Degraded non-Transistors-Mechanisms and Modeling." IEEE Transactions on Electron Devices, vol. 41, No. 4, Apr. 1994, pp. 533-38.
B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.
H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 178-987.
M. Khater, et al., "SiGe HBT Technology with Fmax/Ft = 350/300 GHz and Gate Delay Below 3.3 ps." 2004 IEEE, 4 pages.
J.C. Bean, et al., "GEz Sl 1-x/Si Strained-Layer Superlattice Grown by Molecular Beam Epitaxy." J. Vac, Sci. Technol. A 2(2), Apr.-Jun. 1984, pp. 436-440.
J.H. Van Der Merwe, "Regular Articles." Journal of Applied Physics, vol. 34, No. 1, Jan. 1963, pp. 117-122.
J.W. Matthews, et al., "Defects in Epitaxial Multilayers." Journal of Crystal Growth 27 (1974), pp. 118-125.
Subramanian S. Iyer, et al., "Heterojunction Bipolar Transistors Using a Si-Ge Alloys." IEEE Transactions on Electron Devices, vol. 36, No. 10, Oct. 1989, pp. 2043-2064.
R.H.M. Van De Leur, et al., "Critical Thickness for Pseudomorphic Growth of Si/Ge Alloys and Superlattices." J. Appl. Phys. 64 (6), Sep. 15, 1988, pp. 3043-3050.
D.C. Houghton, et al., "Equilibrium Critical Thickness for Si 1-x GEx Strained Layers on (100) Si." Appl. Phys. Lett. 56 (5), Jan. 29, 1990, pp. 460-462.
Q. Quyant et al., "Two-Dimensional Bandgap Engineering in a Novel Si/SiGe pMOSFET with Enhanced Device Performance and Scalability." 2000,IEEE, pp. 151-154.
Kern Rim, et al., "Transconductance Enhancement in Deep Submicron Strained-Si $n$-MOSFETs", International Electron Devices Meeting, 26, 8, 1, IEEE, Sep. 1998.
Kern Rim, et al., "Characterisics and Device Design of Sub-100 nm Strained Si N- and PMOSFETs", 2002 Symposium on VLSI Technology Digest of Technical Papers, IEEE, pp. 98-99.
Gregory Scott, et al., "NMOS Drive Current Reduction Caused by Transistor Layout and Trench Isolation Induced Stress", International Electron Devices Meeting, 34.4.1, IEEE, Sep. 1999.
F. Ootsuka, et al., "A Highly Dense, High-Performance 130 nm node CMOS Technology for Large Scale System-on-a-Chip Application", International Electron Devices Meeting, 23.5.1, IEEE, Apr. 2000.
Shinya Ito, et al., "Mechanical Stress Effect of Etch-Stop Nitride and its Impact on Deep Submicron Transistor Design", International Electron Devices Meeting, 10.7.1, IEEE, Apr. 2000.
A. Shimizu, et al., "Local Mechanical-Stress Control (LMC): A New Technique for Cmos-Performance Enhancement", International Electron Devices Meeting, IEEE, Mar. 2001.
K. Ota, et al., "Novel Locally Strained Channel Technique for high Performance 55nm CMOS", International Electron Devices Meeting, 2.2.1, IEEE, Feb. 2002.
Notice of Allowance dated Apr. 13, 2012 in U.S. Appl. No. 11/757,874.
Office Action dated Sep. 21, 2011 in U.S. Appl. No. 11/757,874; 7 pages.
Office Action dated Dec. 23, 2010 in U.S. Appl. No. 11/757,874; 8 pages.
Office Action dated Apr. 30, 2010 in U.S. Appl. No. 11/757,874; 8 pages.
Office Action dated Oct. 13, 2009 in U.S. Appl. No. 11/757,874; 8 pages.

* cited by examiner

SILICON DEVICE ON SI: C-OI AND SGOI AND METHOD OF MANUFACTURE

CROSS REFERENCE TO RELATED APPLICATIONS

This application is a divisional application of U.S. application Ser. No. 11/757,883, filed on Jun. 4, 2007, now U.S. Pat. No. 8,119,472, which is a divisional application of U.S. application Ser. No. 10/715,400, filed on Nov. 19, 2003, now U.S. Pat. No. 7,247,534, the contents of which are incorporated by reference in their entirety.

BACKGROUND OF THE INVENTION

1. Field of the Invention

The invention generally relates to a semiconductor device and method of manufacture and, more particularly, to a semiconductor device and method of manufacture which imposes tensile and compressive stresses in the device during device fabrication.

2. Background Description

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., nFETs) and/or p-type devices (e.g., pFETs). However, the same stress component, either tensile stress or compressive stress, discriminatively affects the characteristics of an n-type device and a p-type device.

In order to maximize the performance of both nFETs and pFETs within integrated circuit (IC) chips, the stress components should be engineered and applied differently for nFETs and pFETs. That is, because the type of stress which is beneficial for the performance of an nFET is generally disadvantageous for the performance of the pFET. More particularly, when a device is in tension (e.g., in the direction of current flow in a planar device), the performance characteristics of the nFET are enhanced while the performance characteristics of the pFET are diminished. To selectively create tensile stress in an nFET and compressive stress in a pFET, distinctive processes and different combinations of materials are used.

For example, a trench isolation structure has been proposed for forming the appropriate stresses in the nFETs and pFETs, respectively. When this method is used, the isolation region for the nFET device contains a first isolation material which applies a first type of mechanical stress on the nFET device in a longitudinal direction (e.g., parallel to the direction of current flow) and in a transverse direction (e.g., perpendicular to the direction of current flow). Further, a first isolation region and a second isolation region are provided for the pFET and each of the isolation regions of the pFET device applies a unique mechanical stress on the pFET device in the transverse and longitudinal directions.

Alternatively, liners on gate sidewalls have been proposed to selectively induce the appropriate stresses in the channels of the FET devices (see, Ootsuka et al., IEDM 2000, p. 575, for example). By providing liners, the appropriate stress is applied closer to the device than the stress applied as a result of the trench isolation fill technique.

Also, there have been many proposals to improve both nFET and pFET device performance using tensile and compressive stresses, respectively, which include modulating spacer intrinsic stresses and STI (shallow trench isolation) material changes individually for two MOSFETs using masks. Tensilely strained Si on relaxed SiGe has also been proposed as a means to apply this stress. Unfortunately, the tensilely strained Si on relaxed SiGe can apply only biaxial tensile stress on the Si cap as used in stack form. This constrains the regime of Ge % that is useful because of the nature of pFET sensitivity to stress. The nFET performance monotonically improves with biaxial tension; however, the pFET is degraded with biaxial tension until about 3 GPa at which point it begins to improve.

In order to improve both the pFET and nFET simultaneously, the Ge % needs to be high, approximately greater than 25-30% (or equivalent to approximately greater than 3-4 GPa in stress). This level of Ge % is difficult to implement into processes and is not very manufacturable with major issues including surface roughness, process complexity, defect and yield control, to name but a few. Given that a high Ge % is hard to use for the pFET (since it would be detrimental because of the relatively low levels of tension), other methods must be devised to improve the device performance.

Additionally, Si:C is know to grow epitaxially on Si where it is inherently tensile. A 1% C content in the Si:C/Si material stack can cause tensile stress levels in the Si:C on the order of 500 MPa. In comparison, in the SiGe/Si system about 6% is needed to cause a 500 MPa compression. This 1% level of C can be incorporated into Si during epitaxial growth as shown in Ernst et al., VLSI Symp., 2002, p. 92. In Ernst, the Si/Si:C/Si is in a layered channel for nFETs. However, the Si:C part of the structure is not relaxed. Instead, in Ernst, an unrelaxed Si:C is used as part of the channel, itself, with a very thin Si cap. The problem with this approach is that the mobility is not enhanced, but retarded, depending on the C content, from scattering.

While these methods do provide structures that have tensile stresses being applied to the nFET device and compressive stresses being applied along the longitudinal direction of the pFET device, they may require additional materials and/or more complex processing, and thus, resulting in higher cost. Further, the level of stress that can be applied in these situations is typically moderate (i.e., on the order of 100 s of MPa). Thus, it is desired to provide more cost-effective and simplified methods for creating large tensile and compressive stresses in the channels nFETs and pFETs, respectively.

SUMMARY OF THE INVENTION

In a first aspect of the invention, a method of manufacturing a structure includes forming shallow trench isolation (STI) in a substrate and providing a first material and a second material on the substrate. The first material and the second material are mixed into the substrate by a thermal anneal process to form a first island and second island at an nFET region and a pFET region, respectively. A layer of different material is formed on the first island and the second island. The STI relaxes and facilitates the relaxation of the first island and the second island. In an embodiment, the first material is deposited or grown Ge material and the second material is deposited or grown Si:C or C.

In another aspect, a method of manufacturing a structure includes forming a substrate and shallow trench isolation in the substrate with a first material. A second material over a pFET region and an nFET region is formed, and is then thermally annealed into the substrate to form a first island and a second island of mixed material. A Si layer is grown on the first island in a first region. The Si layer is strained.

In yet another aspect, the method of manufacturing includes forming a substrate and shallow trench isolation of high temperature stable amorphous material, preferably oxide, in the substrate. The method further includes thermally annealing at least one material into the substrate to form a first island and a second island of mixed material and growing a Si layer on at least the first island. The Si layer is strained. In embodiments:

(i) the at least one material is Ge and the first island and the second island is comprised substantially of a mixed material of relaxed SiGe, (ii) the at least one material is C or Si:C and the first island and the second island is comprised substantially of a mixed material of relaxed Si:C, and (iii) the at least one material is Ge and Si:C: or C and the first island are comprised substantially of SiGe and the second island is comprised substantially of Si:C.

In another aspect of the invention, a semiconductor structure includes a substrate and a relaxed shallow trench isolation of high temperature stable amorphous material, preferably oxide, formed in the substrate. A first island of thermally annealed mixed material is formed in the substrate at a pFET region and a second island of thermally annealed mixed material is formed in the substrate at an nFET region. A strained Si layer is formed on at least one of the first island and the second island.

DETAILED DESCRIPTION OF EMBODIMENTS OF THE INVENTION

Figure 1:
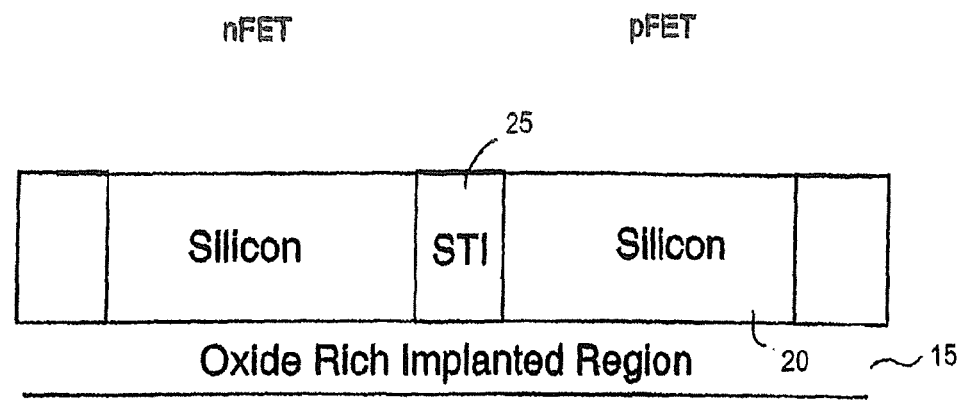
FIGS. 1 through 6 represent a fabrication process to form an intermediate structure in accordance with the invention.

This invention is directed to a semiconductor device and method of manufacture which provides desired stresses in the nFET channel and the pFET channel of CMOS devices for improved device performance. In one approach, a SiGe island is obtained through thermally mixing deposited Ge material into an SOI thin film. Similarly, a Si:C island is obtained through thermally mixing deposited Si:C or C into the Si or SOI thin film. By using the method of the invention, the required Ge % is not large and thus does not cause defect issues. Also, relaxation of SiGe and/or Si:C islands in the channels of the pFET and nFET, respectively, can be achieved by the invention to thus provide improved performance as compared to blanket (SiGe or Si:C) substrates. This is because, in the implementations of the invention, a high temperature thermal mixing step, for example, is provided such that shallow trench isolation (STI) can relax and facilitate the relaxation of the SiGe and Si:C islands.

Prior to the invention, placement of at least two crystal islands with different relaxed crystal lattice (different dimensions between the atoms) was only feasible by wafer bonding techniques where the islands have a relatively large size; however, in the invention, the methods yield a unique substrate with small crystal islands which have a relaxed but different crystal structure. In one implementation, the non-trivial element of such structure is the use of high temperature stable amorphous material, e.g., $SiO_2$, between the islands and the crystal on insulator structure. The unique structure with different (crystal) islands allows for the placement of differently strained layers of optionally different crystals. In a first aspect, the differently strained layers are tensile and compressive Si layers. In another aspect of the invention, the different layers are a tensile Si layer and SiGe layer or a compressive Si layer and Si:C layer.

The invention has a seminal and important contribution to the art of making substrates with islands on insulator with multiple crystal lattice constants. In the invention, for example, a first island (crystal 1) has a lattice constant a≥aSi and the second island (crystal 2) has a lattice constant a≤aSi. In one aspect of the invention, as discussed in greater detail below, a Si epitaxial layer of the invention can be selectively grown, which will strain tensilely and compressively on SiGe and Si:C, respectively. This particular application is suitable, for example, in strained planar nFETs and pFETs.

Additionally, it should be understood that holes are known to have excellent mobility in SiGe, but reliable thermal based oxides are hard to form on this material. However, in one implementation of the invention, a dielectric, high K material, for example, is deposited, such that it is possible to use only relaxed SiGe (crystal 1) for the pFET in tandem with crystal 1 (again relaxed SiGe) with the tensilely strained Si for the nFET. It is also contemplated by the invention to use Si:C with compressively stressed Si for the pFET. Thus, the invention is capable of generalizing to the concept of multiple lattice constant islanded substrates.

Referring now to FIG. 1, a silicon wafer is shown. Such wafers are commercially available starting substrates for various discrete and integrated circuit (IC) semiconductor device applications. In one implementation, silicon on glass (SOI) wafer may be fabricated using the SIMOX (Separation by IMplanted OXygen) process, which employs high dose ion implantation of oxygen and high temperature annealing to form a BOX layer in a bulk wafer. As another example, the wafer can be fabricated by bonding a device quality silicon wafer to another silicon wafer (the substrate layer) that has an oxide layer on its surface. The pair is then split apart, using a process that leaves a thin (relative to the thickness of the starting wafer), device-quality layer of single crystal silicon on top of the oxide layer (which has now become the BOX) on the substrate layer. The SOI wafer may also be formed using other processes.

Still referring to FIG. 1, an Si layer 20 is formed and patterned to form shallow trench isolation (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art. In one implementation, high temperature stable amorphous material, e.g., $SiO_2$, is used for the STI.

Figure 2:
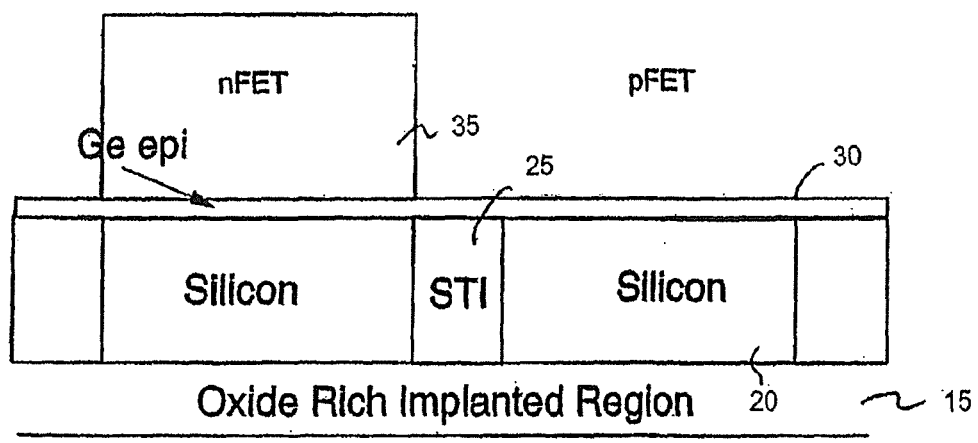

Referring to FIG. 2, an epitaxial Ge material (layer) 30 is deposited over the surface of the structure using conventional techniques such as chemical vapor deposition methods. For example, ultrahigh vacuum chemical vapor deposition (UH-VCVD) may be used in a conventional manner to deposit the Ge layer 30. Other conventional techniques include rapid thermal chemical vapor deposition (RTCVD), limited reaction processing CVD (LRPCVD) and molecular beam epitaxy (MBE). In one embodiment, the thickness of the Ge material may range from 5 to 50 nanometers, or other dimension depending on the thickness of the underlying Si layer which may, for example, range from 30 to 100 nanometers.

An nFET hard mask 35 is provided on a portion of the Ge layer 30 (e.g., at locations of a yet to be formed nFET device). The nFET hard mask 35 may be a nitride hard mask formed using a conventional deposition process such as spin-on coating, CVD, plasma-assisted CVD, ultrahigh vacuum chemical vapor deposition (UHVCVD), rapid thermal chemical vapor deposition (RTCVD), limited reaction processing CVD (LRPCVD) and other like deposition processes.

Figure 3:
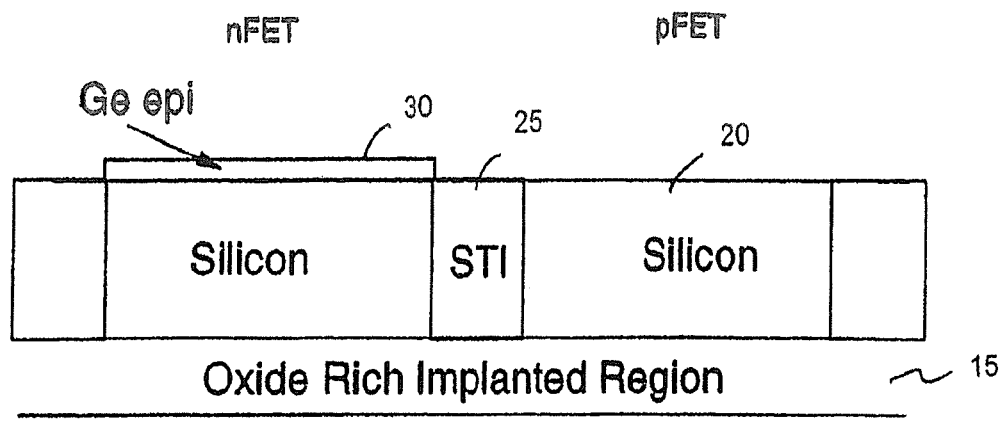

In FIG. 3, the exposed Ge layer 30 is etched and the nFET mask 35 is stripped using techniques known in the art. For example, the Ge layer 30 may be selectively etched using RIE, wet or dry etching.

Figure 4:
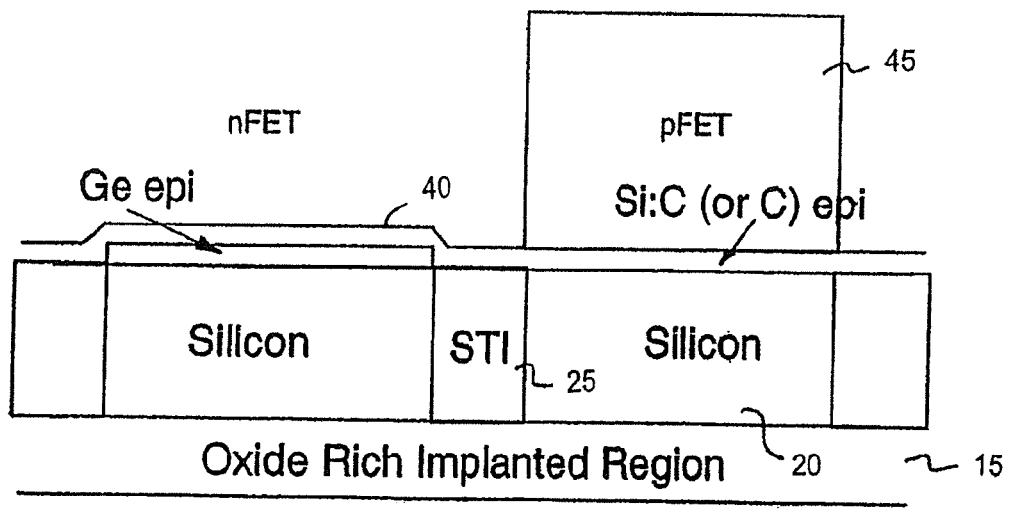

As shown in FIG. 4, a Si:C material 40 (or optionally C) is deposited on the structure, including over the epitaxially deposited Ge material 35. For example, ultrahigh vacuum chemical vapor deposition (UHVCVD) may be used in a conventional manner to deposit the Si:C (or optionally C) material 40. Other conventional techniques include rapid thermal chemical vapor deposition (RTCVD), limited reaction processing CVD (LRPCVD) and other like processes. In one embodiment, the thickness of the Si:C or C material may range from 5 to 50 nanometers, or other dimension depending on the thickness of the underlying Si layer which may, for example, range from 30 to 100 nanometers. In another aspect, when using C, the thickness may range from 1 to 30 nanometers.

A pFET hard mask 45 is provided on a portion of the Si:C material 40 at locations of the yet to be formed pFET. The pFET hard mask 45 may be a nitride hard mask formed using a conventional deposition process such as spin-on coating, CVD, plasma-assisted CVD, ultrahigh vacuum chemical vapor deposition (UHVCVD), rapid thermal chemical vapor deposition (RTCVD), limited reaction processing CVD (LRPCVD) and other like deposition processes.

Figure 5:
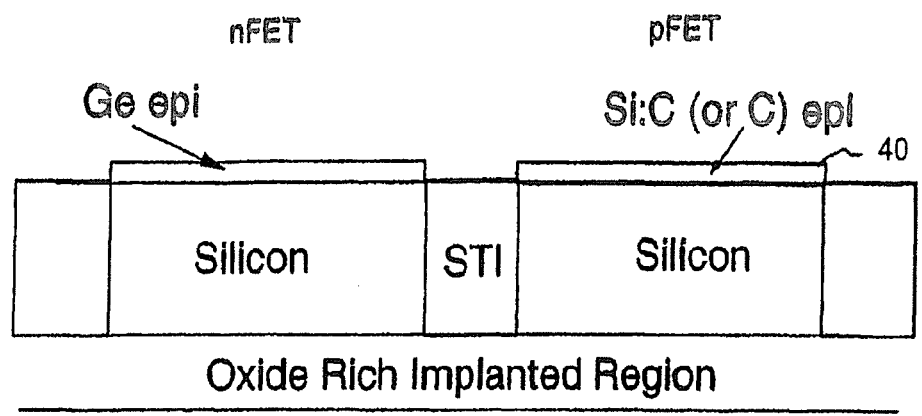

As shown in FIG. 5, the exposed Si:C layer 40 is then etched and the pFET mask 45 is stripped using techniques known in the art. For example, the Si:C and pFET may be etched using standard etching techniques such as, for example, RIE, wet or dry etching and the like.

Figure 6:
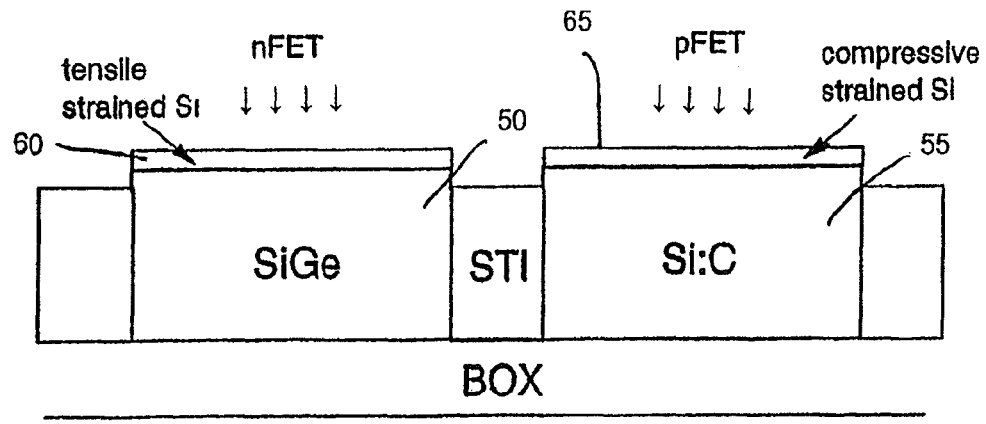

In FIG. 6, the structure then undergoes a thermal annealing process. During this process, for the nFET device, the deposited Ge material 30 is mixed into the underlying SOI film to form an island 50 of substantially SiGe material. Similarly, in this process, for the pFET, the deposited Si:C or optional C material is mixed into the underlying SOI film forming an island 55 of substantially Si:C material. The thermal annealing process takes place, for example, at about 1200° C. to 1350° C. between 1 hour and 10 hours, with one implementation at 1200° C. for approximately 5 hours.

By using the method of the invention, the required Ge % is not large (e.g., less than 25% and in one implementation 10 to 20%) for the nFET and thus does not cause defect issues. Also, due to the high temperature thermal mixing step, for example, the STI 25 can relax and facilitate the relaxation of the SiGe island 50 and Si:C island 55. This is due, in part, because the STI comprises oxide material, which is a viscous material at the high temperature, e.g., becomes a low viscosity material at high temperature.

Also, it should now be understood that the SiGe island 50 and the Si:C island 55 have different relaxed crystal lattice (different dimensions between the atoms) which yield a unique substrate with small crystal islands. The relaxation of the SiGe island 50 and the Si:C island 55 provides improved performance as compared to blanket (SiGe or Si:C) substrates. In an implementation, high temperature stable amorphous material, e.g., $SiO_2$, between the SiGe island 50 and the Si:C island 55 and the crystal on insulator structure are thus used in accordance with the invention.

As further shown in FIG. 6, a Si epitaxial layer 60 is selectively grown on the SiGe island 50 and the Si:C island 55 by known processes. In one aspect of the invention, the selectively grown Si epitaxial layer 60 will strain tensilely and compressively on the SiGe island and the Si:C island, respectively. The Si layer 60 may range in thickness, for example, between 5 and 20 nanometers. As with all dimensions and the like, it is contemplated that other dimensions, temperatures, etc. may be used with the invention depending on, for example, the thickness of the underlying substrate.

Now, in implementation, the SiGe island 50 has a lattice constant a≥aSi and the Si:C island 55 has a lattice constant a≤aSi. That is, standing alone, the Si normally has a lower lattice constant than the SiGe layer; namely, the lattice constant of the Si material does not match the lattice constant of the SiGe layer. However, in the structure of the invention, the lattice structure of the Si layer will tend to match the lattice structure of the SiGe island. Thus, by virtue of the lattice matching of the Si (which normally is smaller) to the SiGe layer, the Si layer is placed under a tensile stress. This area will act as a strained channel for the nFET. In one embodiment, the Ge content of the SiGe layer may be less than 25% in ratio to the Si content.

Also, standing alone, Si would normally have a larger lattice constant than the Si:C island. That is, the lattice constant of the Si material does not match the lattice constant of the Si:C. However, in the structure of the invention, the lattice structure of the Si layer will tend to match the lattice structure of the Si:C. By virtue of the lattice matching of the Si (which normally is larger) to the Si:C island, the Si layer is placed under a compressive stress. That is, similar to the occurrence with the SiGe, the surrounding areas of the Si:C island will try to obtain an equilibrium state thus resulting in a compressive stress of an epitaxial Si layer formed on the Si:C island. This area will act as a strained channel for the pFET. In one embodiment, as deposited, the C content may be from about up to 4% in ratio to the Si content.

Figure 7:
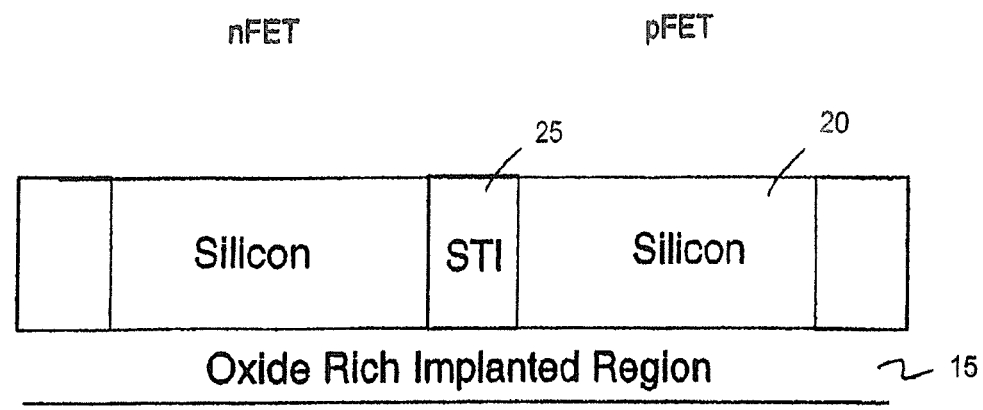
FIGS. 7 through 11 represent a fabrication process to form an intermediate structure in accordance with another aspect of the invention.

FIGS. 7-11 show another aspect of the invention. In FIG. 7, a silicon wafer such as SOI is shown. As in the previously described structure, the SOI may be fabricated using the SIMOX process or other well known processes. An Si layer 20 is patterned to form shallow trench isolation (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art.

Figure 8:
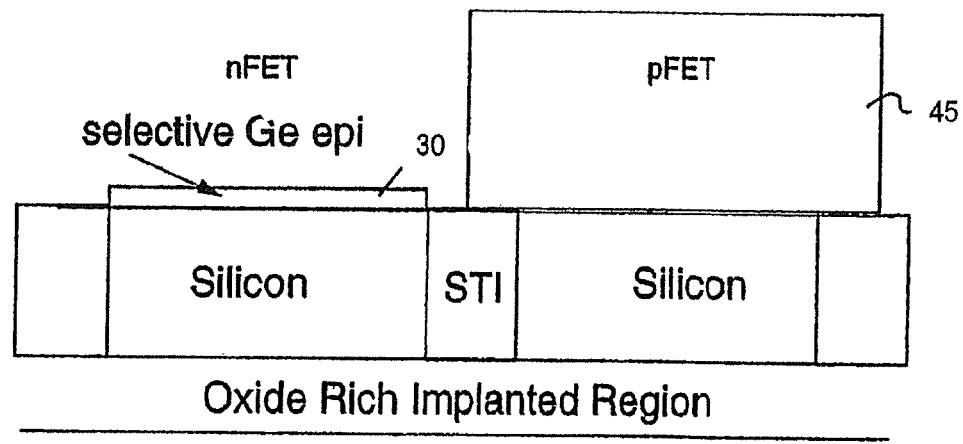

Referring to FIG. 8, a pFET mask 40 is provided on a portion of the structure at locations of the yet to be formed pFET. The pFET hard mask may be deposited using convention techniques such as chemical vapor deposition methods. For example, such techniques may include spin-on coating, CVD, plasma-assisted CVD, evaporation ultrahigh vacuum chemical vapor deposition (UHVCVD), rapid thermal chemical vapor deposition (RTCVD), limited reaction processing CVD (LRPCVD) and other like deposition processes.

An epitaxial Ge layer 30 is selectively grown over the exposed surface of the yet to be formed nFET using conventional techniques. In one embodiment, the thickness of the Ge material may range from 5 to 50 nanometers, or other dimension depending on the thickness of the underlying Si layer which may, for example, range from 30 to 100 nanometers. The hard mask 45 is stripped using well known processes, as discussed above.

Figure 9:
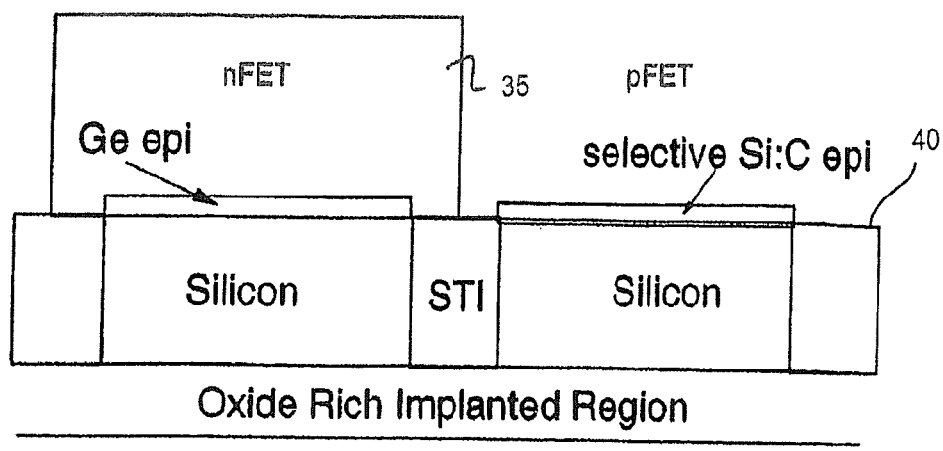

In FIG. 9, an nFET mask 35 is provided on a portion of the structure at locations of the yet to be formed nFET. The nFET hard mask may be deposited using conventional techniques such as chemical vapor deposition methods as discussed throughout and which should be known to those of ordinary skill.

An Si:C layer 40 is selectively grown over the exposed surface of the structure at the yet to be formed pFET using conventional techniques such as chemical vapor deposition method, as discussed above. In one embodiment, the thickness of the Si:C material may range from 5 to 50 nanometers, or other dimension depending on the thickness of the underlying Si layer which may, for example, range from 30 to 100 nanometers. The C may even be thinner ranging from 1 to 50 nanometers.

Figure 10:
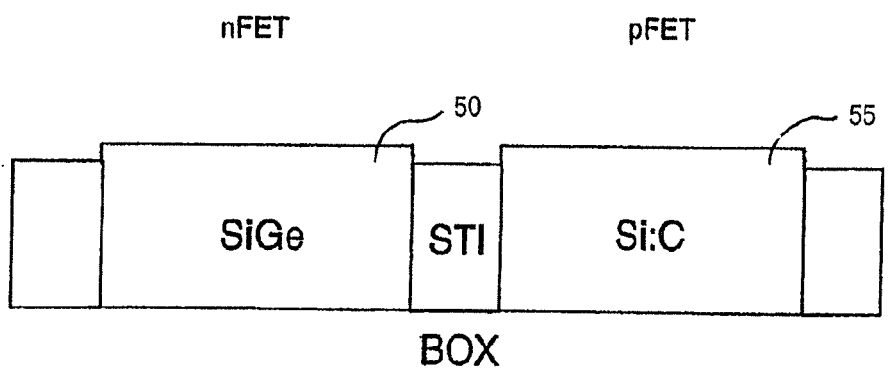

As shown in FIG. 10, the nFET hard mask 35 is then removed using well known processes. The structure then undergoes a thermal annealing process. During the annealing process, for the nFET device, the Ge material 30 is mixed into the SOI film forming an island 50 of substantially SiGe material. Similarly, for the pFET, the Si:C or optionally C material is mixed into the SOI film forming an island 55 of substantially Si:C material. This process also forms a BOX layer, as the substrate. The thermal annealing process takes place, for example, at about 1200° C. to 1350° C. between 1 hour and 10 hours, with one implementation at 1200° C. for approximately 5 hours.

As discussed above, and similar to the previous implementations, by using the method of the invention, the required Ge % is not large (e.g., less than 25% and in one implementation from 10 to 20%) and thus does not cause defect issues. Also, due to the high temperature thermal mixing, for example, the STI 25 can relax and facilitate the relaxation of the SiGe island 50 and Si:C island 55. As previously discussed, the relaxation of SiGe and Si:C provides improved performance as compared to blanket (SiGe or Si:C) substrates. In one implementation of the invention, the element of such structure is the use of high temperature stable amorphous material, e.g., $SiO_2$, between the islands and the crystal on insulator structure.

Figure 11:
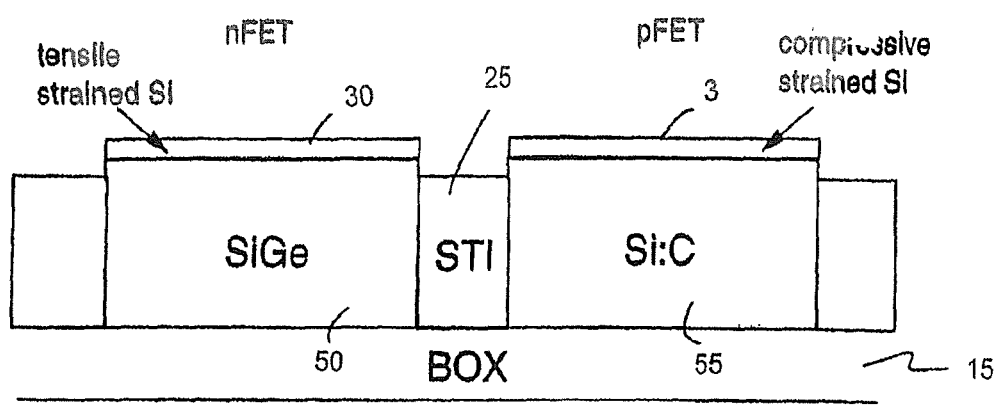

As further shown in FIG. 11, Si epitaxial material 60 is selectively grown on the SiGe island 50 and Si:C island 55. The Si layer 60 may range in thickness, for example, between 5 and 20 nanometers. In this aspect of the invention, the different layers become a tensile Si layer or a compressive Si layer. The tensile Si layer will act as a strained channel for the nFET and the compressive Si layer will act as a strained channel for the pFET.

In another aspect of the invention, C can be implanted at high dose into the pFET region which can produce concentrations much greater than the 1-4% C in the Si:C upon thermal annealing. The dose may be about 1 e 16 #/cm² or greater such as 5 e 16 #/cm².

Figure 12A:
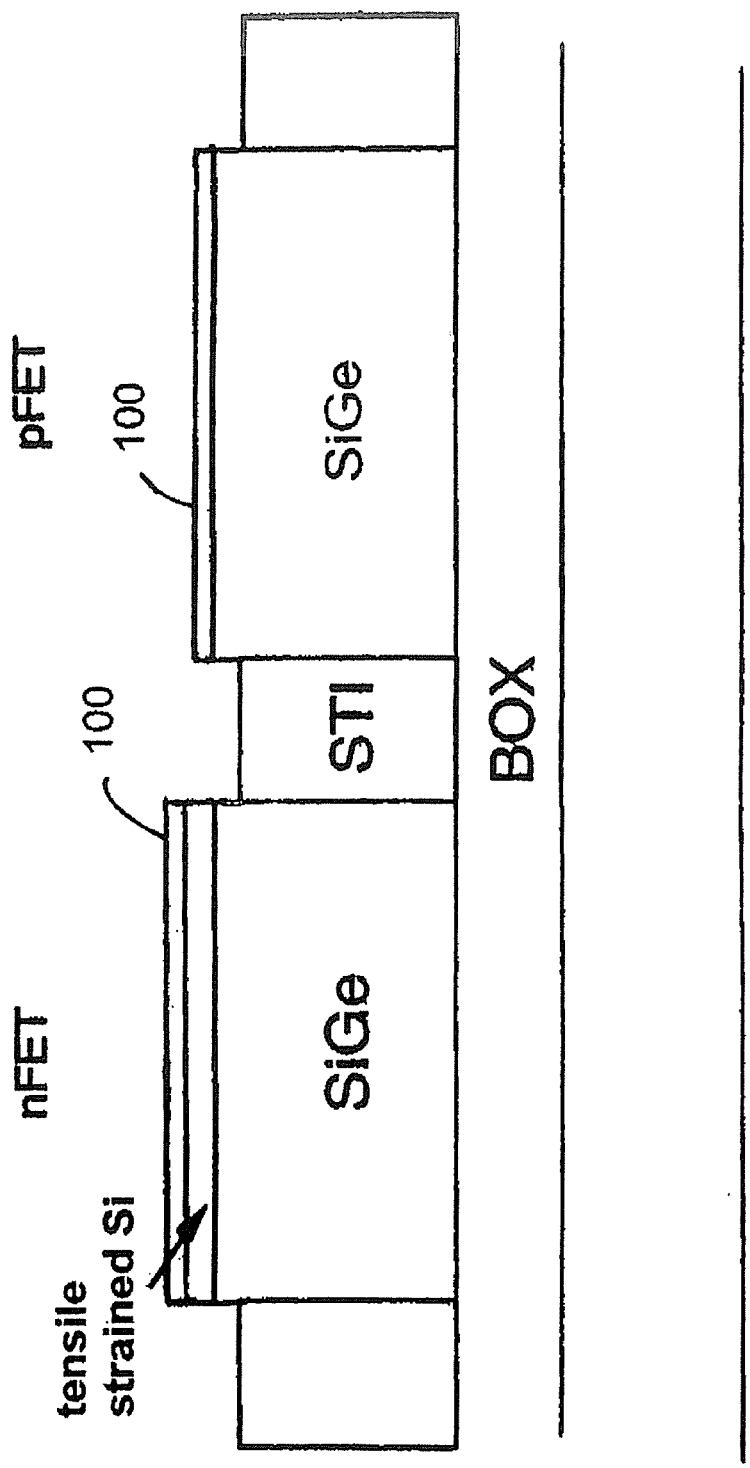
FIGS. 12a and 12b are representative structures of the invention.

In the illustrative example of FIG. 12a, in one implementation, SiGe may be used for both the nFET and the pFET, excluding Si:C or C. In this implementation, a strained Si will be placed on the nFET region but not on the pFET region. Upon fabrication, the nFET will then be in a tensile stress. A high K dielectric 100, though, to begin the fabrication process of the device, is then selectively grown on the structure; that is, the high K dielectric 100 may be grown over the strained Si layer and the exposed SiGe layer. The high K dielectric 100 may be zirconium oxide or aluminum oxide, for example.

Figure 12B:
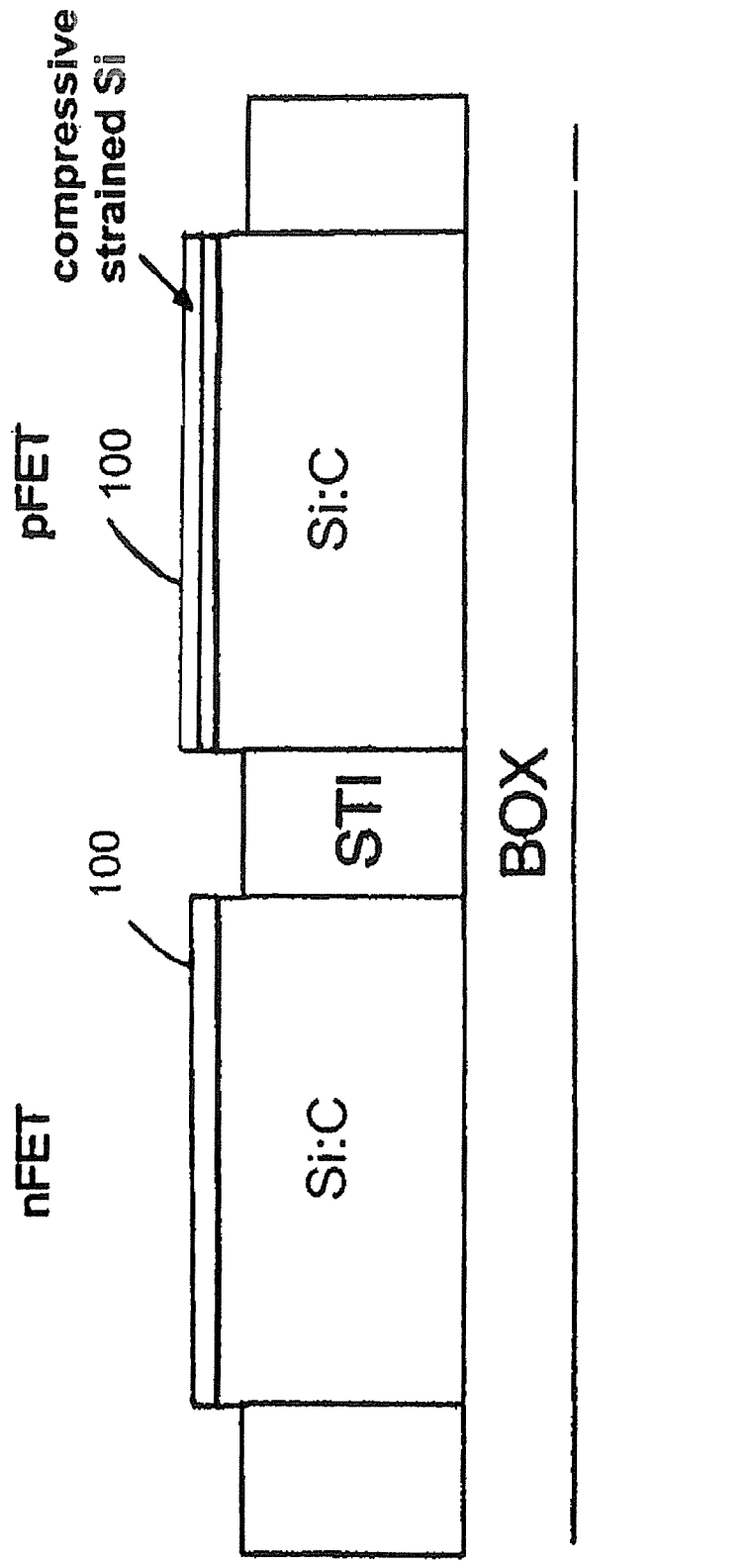

Alternatively, Si:C may be used for both the nFET and the pFET, excluding SiGe. In this implementation, a strained Si will be placed on the pFET region but not on the nFET region. Upon fabrication, the pFET will then be in a compressive stress. A high K dielectric 100, though, to begin the fabrication of the device, is then selectively grown on the structure; that is, the high K dielectric 100 may be grown over the strained Si layer and the exposed Si:C layer. The high K dielectric 100 may be zirconium oxide or aluminum oxide, for example. This is also representative of FIG. 12b. The processes for using Si:C or SiGe remain the same, as discussed above.

The structures formed, as shown in FIG. 6, FIG. 11 and FIGS. 12a and 12b, are intermediate structures that accommodate formation of semiconductor devices, such as pFETs and nFETs, in accordance with the principles of the invention. To form the final device, standard CMOS processes may be performed to form devices such as field effect transistors on the structure, as is well known in the art. For example, the devices may include ion implantation of source and drain regions separated by the semi-conducting channel of strained Si (or Si and SiGe and Si and Si:C). That is, the nFET will be formed over the tensilely strained Si channel and the pFET will be formed over the compressively strained Si channel. A gate oxide is provided atop the strained Si channel, and a gate conductor is provided on top of the gate oxide. Spacers are also provided. These components are found in typical field effect transistors and further explanation is not needed for one of ordinary skill in the art to readily understand the fabrication process of the FET device.

While the invention has been described in terms of embodiments, those skilled in the art will recognize that the invention can be practiced with modification within the spirit and scope of the appended claims. For example, the invention can be readily applicable to bulk substrates.

What is claimed is:

1. A method of manufacturing a semiconductor structure, comprising:
    forming a substrate;
    forming shallow trench isolation (STI) of high temperature stable amorphous material in the substrate;
    providing at least one material over a PFET region and an nFET region;
    thermally annealing the at least one material into the substrate to form a first island and a second island of mixed material, wherein the first island and the second island have a different relaxed crystal lattice with different dimensions between atoms; and
    growing a Si layer on the first island in a first region, wherein the Si layer is strained.

2. The method of claim 1, further comprising relaxing the STI, which facilitates relaxation of the first island and the second island during the thermally annealing step.

3. The method of claim 1, wherein the at least one material is Si:C or C.

4. The method of claim 1, wherein the Si layer becomes compressively strained.

5. The method of claim 1, wherein the thermal anneal step takes place at about 1200 to 1350° C.

6. The method of claim 1, wherein the STI comprises a material that has a lower viscosity as the temperature rises.

7. The method of claim 1, wherein:
    the at least one material is Ge and the Si layer becomes tensilely strained;
    the STI comprises a material that has a lower viscosity as the temperature rises; and
    the at least one material and the substrate are a high temperature stable amorphous material.

8. The method of claim 1, wherein the Si layer has a different lattice constant than the first island such that the Si layer will strain one of tensilely and compressively on the first island.

9. The method of claim 1, wherein:

the at least one material is Ge, C or Si:C and the first island and the second island is comprised substantially of a mixed material of relaxed SiGe;

the Si layer is compressively strained when the mixed material is SiGe and tensilely strained when the mixed material is Si:C; and the Si layer has a different lattice constant than the SiGe material and the Si:C material and the substrate is also formed from a high temperature stable amorphous material.

10. The method of claim 1, wherein the first island has a lattice constant a≥aSi and the second island has a lattice constant a≤aSi.

11. The method of claim 1, wherein the substrate is part of an SOI wafer.

12. The method of claim 1, wherein the forming the STI comprises patterning an underlying Si layer.

13. The method of claim 1, wherein the STI comprises oxide material.

14. A method of manufacturing a semiconductor structure, comprising:

forming a substrate;

forming shallow trench isolation (STI) of high temperature stable amorphous material in the substrate, wherein the forming the STI comprises patterning an underlying Si layer;

providing at least one material over a PFET region and an nFET region;

thermally annealing the at least one material into the substrate to form a first island and a second island of mixed material; and growing a Si layer on the first island in a first region, wherein the Si layer is strained.

15. The method of claim 14, wherein the first island and the second island have a different relaxed crystal lattice.

16. The method of claim 14, wherein the first island has a lattice constant a≥aSi and the second island has a lattice constant a≤aSi.

17. The method of claim 14, wherein the substrate is part of an SOI wafer.

18. The method of claim 14, wherein the STI comprises oxide material.

* * * * *